United States Patent [19]

Stewart et al.

[11] Patent Number: 4,618,876
[45] Date of Patent: Oct. 21, 1986

[54] ELECTRICALLY ALTERABLE, NONVOLATILE FLOATING GATE MEMORY DEVICE

[75] Inventors: Roger G. Stewart, Neshanic Station; Alfred C. Ipri, Princeton, both of N.J.

[73] Assignee: RCA Corporation, Princeton, N.J.

[21] Appl. No.: 633,188

[22] Filed: Jul. 23, 1984

[51] Int. Cl.⁴ .......................................... H01L 29/34
[52] U.S. Cl. .................................... 357/54; 357/23.5; 365/185
[58] Field of Search ................. 357/23.5, 23.14, 54; 365/185

[56] References Cited

U.S. PATENT DOCUMENTS

| 3,500,142 | 3/1970 | Kahng | 317/235 |
| 3,660,819 | 5/1972 | Frohman-Bentchkowsky | 317/235 |
| 4,328,565 | 5/1982 | Harari | 365/185 |
| 4,513,397 | 4/1985 | Ipri | 357/23.5 |
| 4,558,339 | 12/1985 | Angle | 357/23.5 |

FOREIGN PATENT DOCUMENTS 0045578 10/1982 European Pat. Off. .

58-209165 12/1983 Japan .................................. 23.5/

OTHER PUBLICATIONS

"16-K EE-PROM Relies on Tunneling for Byte-Erasable Program Storage", W. S. Johnson, et al., Electronics, Feb. 28, 1980, pp. 113–117.
IBM Technical Disclosure Bulletin, vol. 24, #7A, p. 3311, Dec. 1981 by Alberts.

*Primary Examiner*—Andrew J. James
*Assistant Examiner*—Mark Prenty
*Attorney, Agent, or Firm*—Birgit E. Morris; William J. Burke; Henry Steckler

[57] ABSTRACT

A floating gate structure wherein the floating gate is a second level polysilicon layer that is substantially shielded from the substrate by a segmented, discontinuous first level word line. Coupling of the floating gate to the substrate for "writing" is accomplished by extending the floating gate between word line segments while electrical continuity of the word line is maintained by buried contacts which make electrical contact to a continuous third level polysilicon layer.

5 Claims, 4 Drawing Figures

ELECTRICALLY ALTERABLE, NONVOLATILE FLOATING GATE MEMORY DEVICE

BACKGROUND OF THE INVENTION

This invention relates, in general, to semiconductor memory devices and more particularly, to electrically alterable, nonvolatile floating gate memory devices.

The microprocessor based systems, as well as the related arts, have long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, they have inherent shortcomings that are overcome by the subject invention.

One such device resides in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the device which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is constructed by first applying a thin insulating layer followed by a conductive layer (the floating gate) which is usually followed by a second insulating layer in order to completely surround the floating gate and insulate it from the remainder of the device. A second conductive layer (usually referred to as the control gate) is formed over the second insulating layer (in the region of the floating gate) to complete the gate structure. Such devices are exemplified in U.S. Pat. No. 3,500,142 which issued to D. Khang on Mar. 10, 1970 and U.S. Pat. No. 3,660,819 which issued to D. Frohman-Bentchkowsky on May 2, 1972.

The major drawback of these prior art devices resides in the fact that high fields are required to produce the necessary avalanche breakdown in order for charge to be placed on the floating gate. Further, to erase charge placed on the floating gate, the entire device must be provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In recent years, the art has progressed to the point where nonvolatile, floating gate read only memory devices have been produced which are electrically alterable. One such memory cell has been described in detail in an article entitled "16-K EE-PROM Relies on Tunneling for Byte-Erasable Program Storage" by W. S. Johnson, et al., *ELECTRONICS*, Feb. 28, 1980, pp. 113-117. In this article, the authors describe a "Floating-Gate Tunnel Oxide" structure wherein a cell using a polycrystalline silicon (polysilicon) floating gate structure has its gate member charged with electrons (or holes) through a thin oxide layer positioned between the floating gate and the substrate by means of the Fowler-Nordheim tunneling mechanism. An elevation view of a typical device is described, and shown in FIG. 1 of the article, wherein the floating gate member represents the first polysilicon level. By using this type of structure (a structure wherein the first level polysilicon represents the floating gate since it is closest to the substrate, and is covered by a second polysilicon level) an excessively high floating gate-to-substrate capacitance is produced. However, acceptably low "write" and "erase" operations can only be achieved when most of the applied voltage appears across the tunnel region which requires that the floating gate-to-control gate (second polysilicon level) capacitance be larger than the floating gate-to-substrate capacitance. Further, to achieve the required distribution of capacitance to produce the acceptable "write" and "erase" characteristics, the prior art has resorted to extending both the first and second polysilicon levels over the adjacent field oxide to obtain the additional capacitance. The net result is an undesirably large cell.

In one recent application, filed in the U.S. Patent and Trademark Office on Oct. 18, 1982, Ser. No. 437,271 entitled "AN ELECTRICALLY ALTERABLE, NONVOLATILE FLOATING GATE MEMORY DEVICE," and assigned to the same assignee as the subject application, and now U.S. Pat. No. 4,558,339, there is described a novel configuration of a floating gate memory device wherein the floating gate is a second level polysilicon rather than the traditional first level polysilicon. This is done in order that the second level polysilicon floating gate be provided with a shield. The first level polysilicon is provided with an aperture and the second level floating gate is made to extend through the aperture so that only a relatively small area of the second level floating gate is coupled to the substrate. By providing such a structure it was found that the otherwise high floating gate-to-substrate capacitance was reduced. These ends are accomplished by providing a dual section portion, extending from the source region, to create an auxiliary channel region for "erasing" and "writing" into the resultant cell.

In another recent application entitled "AN ELECTRICALLY ALTERABLE, NONVOLATILE FLOATING GATE MEMORY DEVICE," filed by the subject inventors in the U.S. Patent and Trademark Office on Dec. 10, 1982, Ser. No. 448,690, and assigned to the same assignee as the subject application, and now U.S. Pat. No. 4,513,397 we describe an electrically alterable, nonvolatile floating gate memory device wherein the floating gate portion is the second level polysilicon. In our co-pending application, we are able to reduce the area previously occupied by each device by coupling the floating gate to the substrate at the portion of the channel region that conduction takes place. The coupling takes place through a self-aligned, rectangularly shaped aperture in the first level polysilicon layer. The aperture has its short sides parallel to the sides of the first level polysilicon layer, but spaced therefrom to allow for mask alignment tolerances. The optimum dimension of the aperture was found to be about 5 microns long and about 2 microns wide with a 2 micron tolerance between each end of the aperture and the adjacent side of the first level polysilicon. This then dictated that the side-to-side dimension of the first and third level polysilicon layers be about 9–10 microns while the aperture is about 5 microns long. In practice, it was found that each device required a minimum active area of about 210 square micrometers (micron) to provide reliable devices consistent with good manufacturing techniques in order to produce consistently high yields. By removing the need to maintain certain mask tolerances, we find that the active area can be reduced by about 30%, thus making space available for additional devices in the same chip area.

SUMMARY OF THE INVENTION

In the subject application, as in our prior, co-pending application, the polysilicon floating gate is a second level polysilicon layer rather than the prior art first level in order to provide a structure wherein the second level polysilicon floating gate is shielded from the substrate by the first level polysilicon (the program or control gate). The first level polysilicon is now a discontinuous layer and is provided with a slot so that only a small portion of the second level polysilicon (floating gate) extends through the slot whereby only a relatively small area of the second level polysilicon is coupled to the substrate.

In order to conserve chip area and thus increase chip density (the number of devices in a given area), the subject application teaches the elimination of certain portions of the first and second level polysilicon layers and how to provide electrical continuity by means of buried contacts.

DETAILED DESCRIPTION OF THE PREFERRED EMBODIMENT

Figure 1:
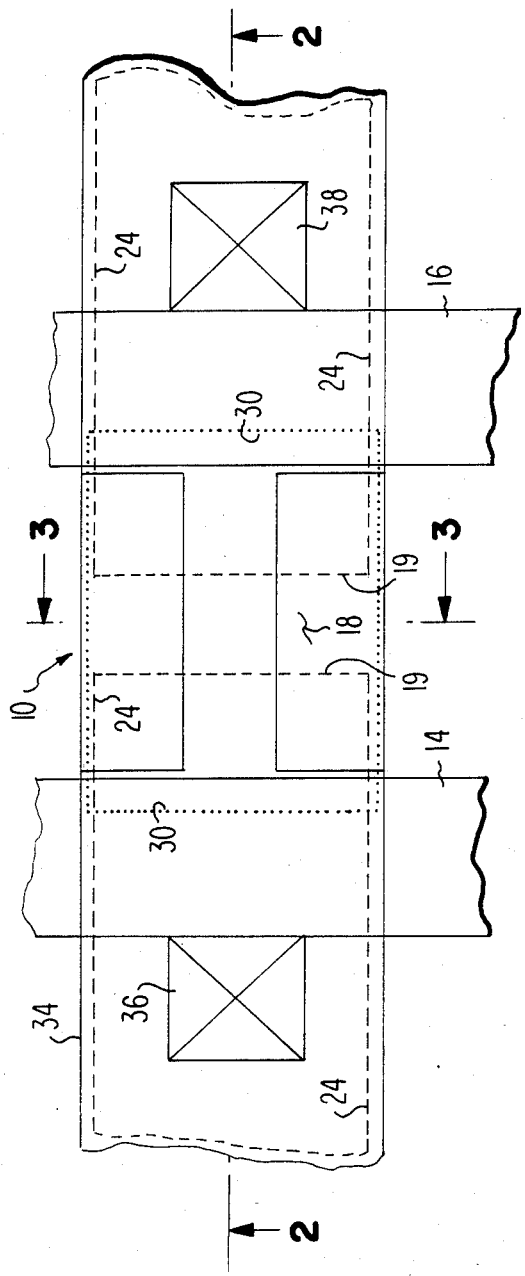
FIG. 1 is a plan view of an electrically alterable, nonvolatile floating gate memory device made in accordance with the teachings of our invention.
Figure 2:
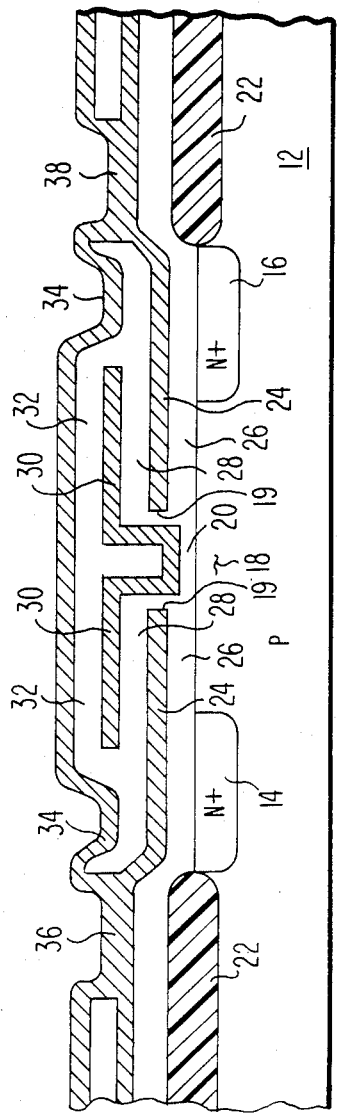
FIG. 2 is a cross-sectional, elevation view of our novel memory device taken along line 2—2 of FIG. 1.
Figure 3:
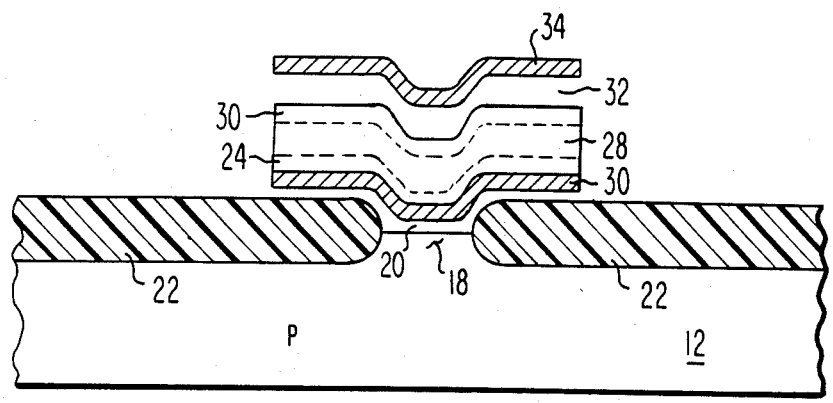
FIG. 3 is a cross-sectional, elevation view of our novel memory device taken along line 3—3 of FIG. 1.

Referring now to FIGS. 1, 2 and 3, there is shown a single device 10 formed in a P-doped substrate 12 with oppositely doped source and drain regions 14 and 16, respectively, separated by channel region 18. In order to simplify both the drawing and the associated explanation, it will be understood by those skilled in the art that the device 10 could also be formed in a P-doped well that had been previously formed in an N-doped substrate. The use of substrates and oppositely doped wells provides certain isolation that may be desirable in certain circumstances.

At the surface of the P-doped region are field oxide regions 22 which define the limits of each active region for device 10, it being understood that the active region or area consists of source line 14, drain line 16 and channel region 18. Above the channel region 18, and oriented in a direction generally parallel thereto, is a first level discontinuous polysilicon layer 24, representing a word line or control gate. One portion of layer 24 starts over source region 14 and terminates over channel region 18 to form one side of slot 19 while the other portion starts over drain region 16 and terminates over channel region 18 to form the other side of slot 19. Both portions are separated and insulated from the surface of substrate 12 by means of insulator layer 26 which may, for example, have a thickness of about 500 Angstroms. A second level polysilicon layer 30 (the floating gate) is positioned above and generally parallel to both portions of first polysilicon layer 24 and is shown having a portion thereof extending through the slot 19 formed between the ends of layer 24. Layer 30 is insulated from channel region 18 by means of insulating oxide layer 20 which is thinner than insulating layer 26. The need for the insulator 20 to be thinner than insulating layer 26 will be discussed later. The area of coupling of the second level polysilicon layer 30 to the substrate which, together with the slot 19 formed between the ends of layer 24, is referred to as the write window. The remainder of second level polysilicon layer 30 (floating gate) is insulated from the first level polysilicon layer 24 (word line/control gate) by means of insulating layer 28 which may, for example, have a thickness of about 400 Angstroms.

Finally, a third level polysilicon layer 34 is formed over floating gate 30 that is electrically connected to first level polysilicon layer 24 by means of buried contacts 36 and 38. The third level polysilicon layer 34 is insulated from second level polysilicon layer 30 (floating gate) by an insulating layer 32 which may, for example, have a thickness of about 300 Angstroms.

Referring again to FIGS. 1, 2 and 3 it should now be observed that, to obtain optimum tunneling it is important to maintain as much of the applied field as possible between the floating gate 30 and the substrate or P well 12. Accordingly, the floating gate (30)-to-channel (P well 12) capacitance must be reduced while the word line/control gate (24–34)-to-floating gate (30) capacitance must be increased to as large a value as possible. However, the floating gate (30)-to-channel (P well 12) capacitance is governed by the thickness of the oxide layer 20 under the slot 19. This oxide thickness should not be increased much above a thickness of about 120 Angstroms as this would tend to decrease current density which would then require higher fields or longer times to charge the device. Thus, this thickness represents an upper limit and will be determined by tunneling requirements. Since, therefore, the tunneling oxide cannot be made thicker, we have chosen to make the interpolysilicon (polysilicon-to-polysilicon) capacitance much larger than the polysilicon-to-substrate capacitance by providing a minimum area tunneling section in combination with the large polysilicon word line/control gate (24–34)-to-floating gate (30) area.

As previously stated, the improvement of the subject invention over our prior application resides in a significant reduction in the active area occupied by each device. For example, in practice it was found that in order to manufacture devices with more than just a minimum yield, certain mask tolerances must be maintained. The width of the first, second and third level polysilicon layers in our prior application (corresponding here to layers 24, 30 and 34) are all aligned and are about 10 microns wide while the length of the aperture (corresponding to slot 19) is about 5–6 microns. To insure that there is electrical continuity all along layer 20, mask tolerances dictated that an additional 2 microns be added to the width of the first polysilicon layer at each end of aperature formed therein, resulting in an increase of about 4 microns.

In the subject application, we remove the need to include the masking tolerance and thus save valuable space. In our prior application, the active area occupied by each device was found to be about 14 microns by about 15 microns (210 square microns). By reducing the width of the word line 24 of the subject application by 4 microns to about 10 microns, we now have an active area of about 10 microns by about 15 microns (150 square microns) thus effecting almost a 30% reduction in the active area. Thus, by utilizing a slot 19 configuration as shown in FIGS. 1 and 2, we eliminate the aperture of our prior application as well as the need for mask tolerance. However, to maintain the required electrical continuity between word lines 24 of adjacent devices, the buried contacts 36 and 38 (FIG. 1) are formed between layers 24 and 34.

The following table shows the nominal potentials applied to the various elements of our device in order to perform the "erase", "$\overline{\text{erase}}$", (inhibit erase), "write", "$\overline{\text{write}}$" (inhibit write) and "read" functions of an electrically alterable memory device. In the table, the various potentials shown in each of the columns are applied to the elements in the columns entitled "ELEMENT".

| ELE-MENT | READ | WRITE | $\overline{\text{WRITE}}$ | ERASE | $\overline{\text{ERASE}}$ |
|---|---|---|---|---|---|
| Source (14) | 0 V | 0 V | 20 V | 20 V | 20 V |
| Drain (16) | 5 V | 0 V | 20 V | 20 V | 20 V |
| P well (12) | 0 V | 0 V | 0 V | 20 V | 0 V |
| Word Lines (24, 34) | 5 V | 20 V | 0 or 20 V | 0 V | 0 or 20 V |

Thus, as shown in the above table, the device is initially erased by placing a 20 volt signal on drain 16, source 14 and P well 12. This initial "erase" cycle places a positive charge on floating gate 30 which puts the channel region in a low threshold (high conduction) state. However, there will be no electron flow through the channel region unless and until the proper "read" voltages, as indicated in the above table, are applied. This provides a convenient method for checking the devices to determine that all the elements in the array are, in fact, erased. To be certain that the non-selected cells are not erased (placed in a high conduction/low threshold state), an erase (erase inhibit) signal of zero volts is applied to P well 12 and a signal of about 20 volts is applied to all sources 14 and drains 16.

To "write", a 20 volt signal is placed on word lines 24, 34 while source 14, drain 16 and P well 12 are maintained at ground potential (zero volts). This has the effect of placing a negative charge on floating gate 30 which puts the channel region in a high threshold (low conduction state). Under these conditions, the negative charge on floating gate 30 will prevent the channel region from being inverted and no conduction can take place between source 14 and drain 16 during the read cycle. To be certain that only the selected cell is "written", a "$\overline{\text{write}}$" (write inhibit) signal of about 20 volts is applied to those sources 14 and drains 16 of those devices that it is desired to remain unwritten. To "read" the device, that is, to determine whether a high or a low threshold state has been written into the given cell, a 5 volt signal is placed on drain 16 and word lines 24, 34 while source 14 and P well 12 are maintained at ground potential. The indication of conduction under these circumstances will thus signify the presence of a low threshold state (erased) device.

Figure 4:
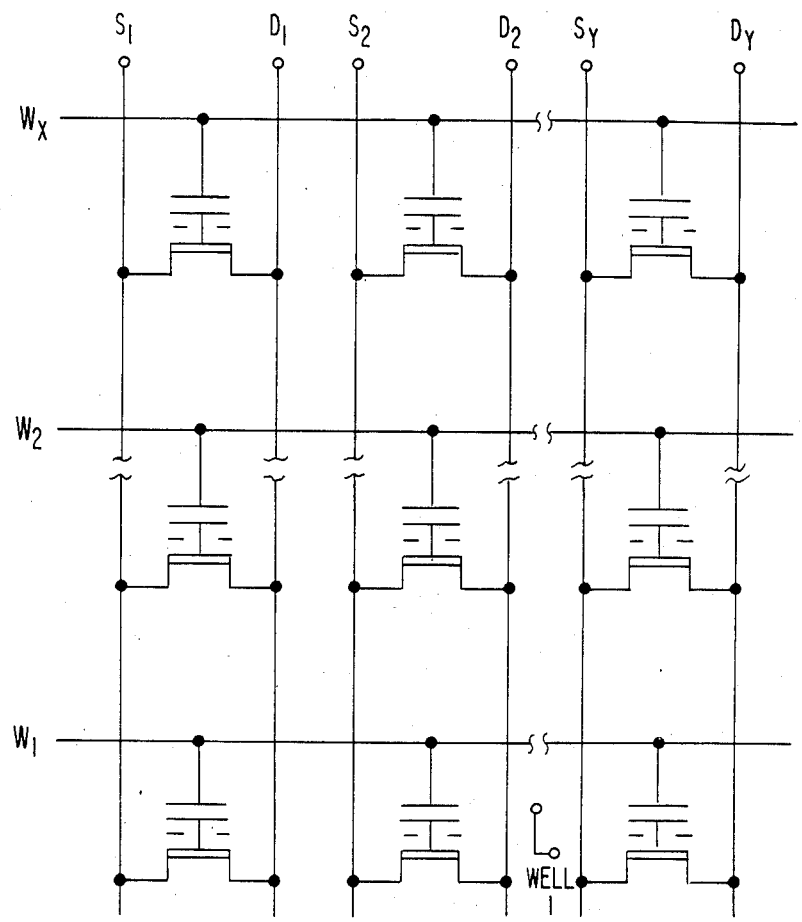
FIG. 4 is a schematic representation of an array of devices of our invention.

While we have described the operation of a single device, it should be obvious to those skilled in the art that a plurality of these devices may be assembled in rows and columns to form an array. Structurally, each active device of FIGS. 1, 2 and 3 would have each portion 24 extend over a field oxide region 22 to an adjacent drain or source region of the next adjacent active device in the same row while layer 34, together with buried contact means 36 and 38, would provide the necessary electrical continuity for all devices in the row. One such array is illustrated in FIG. 4 where we have shown how our novel device may be arranged in a single well. In this FIGURE, the lines labelled S1 and D1 denote the common source and drain lines (14 and 16) shared by all the devices in the first column, while S2-D2 through Sy-Dy denote the remaining columns and their respective shared sources and drains. W1, W2-Wx indicate the common word lines (24, 34) in each row. Thus, to form a 1024-bit array, one would form eight columns (S1-D1 through S8-D8) with one hundred twenty-eight devices connected to word lines W1-W128. If, for example, one were desirous of assembling a 16 thousand (2 K×8) bit array, one would first form 16 P wells each of which would have 8 of these devices in a row and 128 rows high. Thus, each P well would have 1024 of these devices and the array would contain 16,384 cells. Each of the 128 devices in a column in a given P well should share the same source and drain lines 14 and 16 while each of the devices in the same horizontal row of all wells would share common word lines 24, 34. However, each device would have its own floating gate member 30. Accordingly, by appropriately biasing the source and drain lines 14 and 16 as well as P wells 12 as shown in the above table, one could very easily "write" or "read" any one of the 16 thousand devices present and "erase" all of the devices in a given row in a given well.

While we have chosen to describe our device in terms of multiple layers of polysilicon (polysilicon silicon), we do not wish to be so limited. It should now be obvious to those skilled in the art that various other conductive layers such as refractory metals, refractory metal silicides, etc., or any combination thereof, may be used in place of polysilicon layers 24, 30 and 34.

What we claim is:

1. In a floating gate memory device of the type including a body of semiconductor material of a first conductivity type having first and second doped regions of a second conductivity type formed in the semiconductor body at the surface thereof, the first and second doped regions spaced one from the other to define a channel region therebetween in the semiconductor body for supporting current flow between the doped regions, a first conductive layer insulated from the body of semiconductor material and a second conductive layer positioned over both the channel region and the first conductive layer and insulated therefrom, the improvement comprising:

the first conductive layer being discontinuous, one portion thereof positioned over and extending from a point at least over the first doped region toward an end terminating over the channel region, another portion thereof positioned over and extending from a point at least over the second doped region toward an end terminating over the channel region;

the ends of both portions defining a slot therebetween aligned with the channel region;

the second conductor layer positioned over corresponding portions of the first conductive layer and extending into slot defined by the ends of the portions, for coupling to the channel region; and means for electrically connecting said portions of said first conductive layer together.

2. The floating gate memory device of claim 1, wherein:

the first conductive layer is a word line that is insulated from the semiconductor body by a layer of silicon oxide of about 500 Angstroms; and the second conductive layer is the floating gate, the portion thereof that is coupled to the channel region is insulated therefrom by a layer of silicon oxide of about 100 Angstroms, the remainder of which is insulated from the first conductive layer by a layer of silicon oxide of about 400 Angstroms.

3. The floating gate memory device of claim 2, wherein said electrically connecting means comprises:

a third conductive layer positioned over and aligned with the second conductive layer and insulated therefrom by a layer of silicon oxide of about 300 Angstroms; and contact means for electrically connecting each portion of the first conductive layer to the third conductive layer.

4. The floating gate memory device of claim 3, further comprising:

a plurality of devices arranged in rows and columns;

each device in a given column sharing a common source region and a common drain region; and each device in a give row sharing a common first conductive layer.

5. The floating gate memory device of claim 4, further comprising:

a plurality of well regions of the first conductivity type formed in a substrate of the second conductivity type;

the plurality of devices in each of the well regions are arranged in rows and columns;

each device in a given row in all of the well regions sharing a common first conductive layer; and each device in a given column of a given well region sharing a common source region and a common drain region;

whereby when a voltage of a first value is applied to the well region and to each of the plurality of drain and source regions and 0 (zero) volts is applied to each of the plurality of first conductive layers, all such memory devices are erased to a low threshold, high conduction state; and when a selected drain region, and a corresponding source region formed in a given well all have 0 (zero) volts applied thereto and the first conductive layer of a given row has the voltage of the first value applied thereto the selected memory device is written to a high threshold, low conduction state.

* * * * *